United States Patent [19]

Seibert

[11] Patent Number: 5,650,967
[45] Date of Patent: Jul. 22, 1997

[54] METHOD AND APPARATUS FOR WRITING AND ERASING FLASH MEMORY

[75] Inventor: Michael J. Seibert, Eagle, Id.

[73] Assignee: Micron Technology, Inc., Boise, Id.

[21] Appl. No.: 498,596

[22] Filed: Jul. 6, 1995

[51] Int. Cl.⁶ .................................................. G11C 11/34
[52] U.S. Cl. ........................ 365/185.33; 365/185.08; 365/185.29
[58] Field of Search ....................... 365/52, 185.33, 365/185.29, 185.08

[56] References Cited

U.S. PATENT DOCUMENTS

| | | | |
|---|---|---|---|
| 4,402,065 | 8/1983 | Taylor | 365/230.03 |
| 4,408,306 | 10/1983 | Kuo | 365/185.33 |
| 5,043,946 | 8/1991 | Yamauchi | 365/149 |
| 5,197,026 | 3/1993 | Butler | 365/222 |
| 5,272,664 | 12/1993 | Alexander | 365/230.03 |
| 5,353,427 | 10/1994 | Fujishima | 365/230.03 |
| 5,388,248 | 2/1995 | Robinson | 365/52 |

FOREIGN PATENT DOCUMENTS

| | | | |
|---|---|---|---|
| 1135795 | 11/1986 | Japan | 365/230.03 |

OTHER PUBLICATIONS

Intel, Advance Information, 28F016XD, 16–mbit (1Mbit× 16) DRAM–Interface Flash Memory, Order No. 290533–001, Intel Corporation, Oct. 1994, pp. 1–55.

Primary Examiner—David C. Nelms
Assistant Examiner—Michael T. Tran

[57] ABSTRACT

A DRAM-compatible nonvolatile memory includes a FLASH memory and a logic controller. The logical controller accepts conventional DRAM command protocol and accepts data and addresses from DRAM data and address buses, respectively. The logic controller responds to repeated CAS-before-RAS signals and a write enable signal to initiate block erases and writes to the FLASH memory. The nonvolatile, DRAM-compatible memory is incorporated in a package having the same pin structure as a conventional DRAM package, such that the nonvolatile, DRAM-compatible memory can be mounted in a DRAM mount, such as a socket. Because the nonvolatile, DRAM-compatible memory can share common data, address, and command lines with conventional DRAMs, a single memory card can be produced containing both conventional DRAMs and the nonvolatile, DRAM-compatible memories.

25 Claims, 4 Drawing Sheets

METHOD AND APPARATUS FOR WRITING AND ERASING FLASH MEMORY

TECHNICAL FIELD

The present invention relates to electrical erasable nonvolatile memories, and more particularly, two nonvolatile memories responsive to volatile memory signals.

BACKGROUND OF THE INVENTION

Volatile memories, such as dynamic, random access memories (DRAMs), are widely used in computer systems. DRAMs provide a relatively inexpensive volatile memory to which data may be stored rapidly and from which data may be retrieved rapidly. The utility of DRAMs and other types of volatile memories is limited by their volatility. When power is removed, data stored in such volatile memories is lost.

Common nonvolatile memories, such as read only memories (ROMs), overcome this weakness of volatile memories by retaining data when power is removed. However, conventional ROMs do not permit stored data to be erased and replaced, as indicated by the name read only memory.

One type of device having some of the advantages of volatile memories and some of the advantages of nonvolatile memories is the electrically erasable programmable read only memory (EEPROM). EEPROMs are nonvolatile memories in which data may be stored and retrieved. However, writing data to an EEPROM is often quite slow and requires a specialized command protocol. In particular, EEPROMs typically require that a memory location be erased before it will accept new data. EEPROMs are also typically quite expensive relative to volatile memories such as DRAMs.

A less expensive alternative to conventional EEPROMs is the FLASH memory type of EEPROM. However, conventional FLASH memories require specific command sequences for writing data to memory locations. In particular, memory locations typically must be erased in blocks prior to data being written. The specific command structure and requirement for block erase before writing have rendered FLASH memories as inadequate replacements for conventional volatile memories.

SUMMARY OF THE INVENTION

An integrated, nonvolatile memory, circuit includes a FLASH memory within a DRAM-socket compatible package. The memory circuit also includes a logic controller having a row address select (RAS) input, a column address select (CAS) input, a write enable input, and a write protect input. In response to a specified conventional DRAM control sequence, the logic controller initiates a block erase sequence in the FLASH memory. Then, the logic controller enables data from a data line to be transferred from a data buffer to the erased memory locations. The logic controller, which is incorporated within the integrated memory, circuit, includes a state machine and command execution logic.

In one embodiment, the logic controller accepts a repeated CAS-before-RAS signal (CBR signal) as a proper command sequence to initiate the block erase. The CBR signal is a conventional DRAM signal that controls refreshes of the DRAM memory cells. Upon repetition, the CBR signal allows data to be written to the FLASH memory. To prevent incorrect interpretation of the repeated CBR signal, the write enable signal is held "true" during the first CBR signal producing a WCBR sequence. The write enable signal may be toggled during the second CBR signal so the overall sequence is a WCBR-CBR sequence.

The use of the WCBR-CBR sequence by the logic controller eliminates the need for a separate block erase command to write to the FLASH memory. The logic controller therefore accepts conventional DRAM read and write commands to read or write data from the FLASH memory.

Because the nonvolatile memory circuit conforms to conventional DRAM packaging and command sequences, the nonvolatile memory circuit may be used in conjunction with DRAM devices coupled to a common address bus and a common data bus. By sharing common buses with conventional DRAM devices, the nonvolatile memory allows a reconfigurable memory to be realized with conventional DRAM devices and the inventive nonvolatile memory devices on a common memory card. Additionally, such a memory card can be reconfigured by substituting nonvolatile memory packages for DRAM packages or vice versa. By reconfiguring the memory card in such a fashion, the relative amounts of nonvolatile memory and rapid volatile memory may be adjusted to conform to a desired configuration.

DETAILED DESCRIPTION OF THE INVENTION

Figure 1:
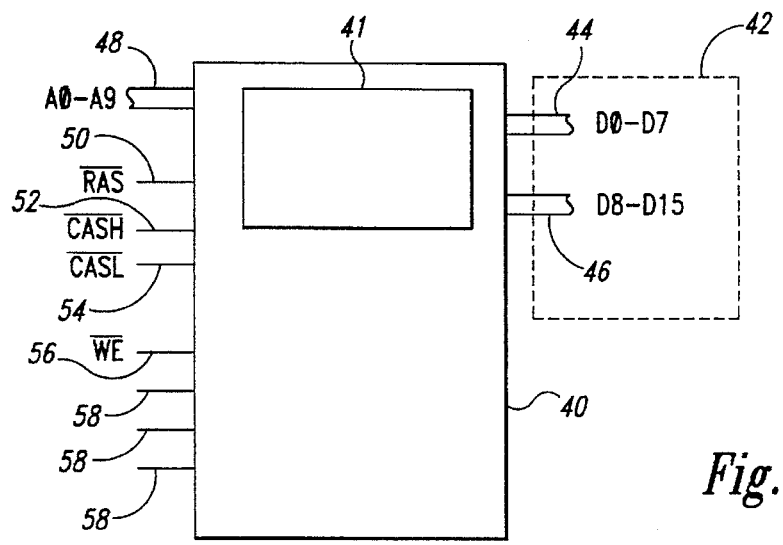
FIG. 1 is a diagrammatic representation of an integrated circuit package having conventional DRAM inputs.

As shown schematically in FIG. 1, a conventional DRAM package 40 houses a memory array 41, which may be a DRAM or a nonvolatile memory according to the present invention. It will be understood that the conventional DRAM package 40 of FIG. 1 may be one of several types of packages. For example, the package 40 may be a surface mounted device or an insertion type of device, such as a dual in-line package.

The package 40 couples to a 16-bit data bus 42 having two 8-bit data lines 44, 46 that are typically used as both data input lines and data output lines to supply data to the package 40 and to accept data from the package 40. The package 40 also accepts several inputs, including an address bus 48, a row address select line (RAS line) 50, a pair of column address select lines (CAS lines) 52, 54 and a write enable line 56. The package 40 also includes extra pins 58 that may be unused or may be used for specific optional features.

The address bus 48 carries a 10-bit address signal identifying addresses of locations within the memory array 41. The address signal is provided from an external source such as an address decoder (not shown). The RAS line 50 carries a row address select signal RAS which, in its "true" state, is low. Likewise, the CAS lines 52, 54 carry column address select signals CASH, CASL, which are also low in their "true" states and the write enable line 56 carries a write enable signal WE that is low in its "true" state. The row address select signal RAS and column address select signals CASH, CASL are externally supplied, conventional DRAM command signals initializing selection of rows and columns within the memory array 41. The write enable signal WE is also a conventional DRAM command enabling the writing of data to locations in the memory array 41.

Figure 2:
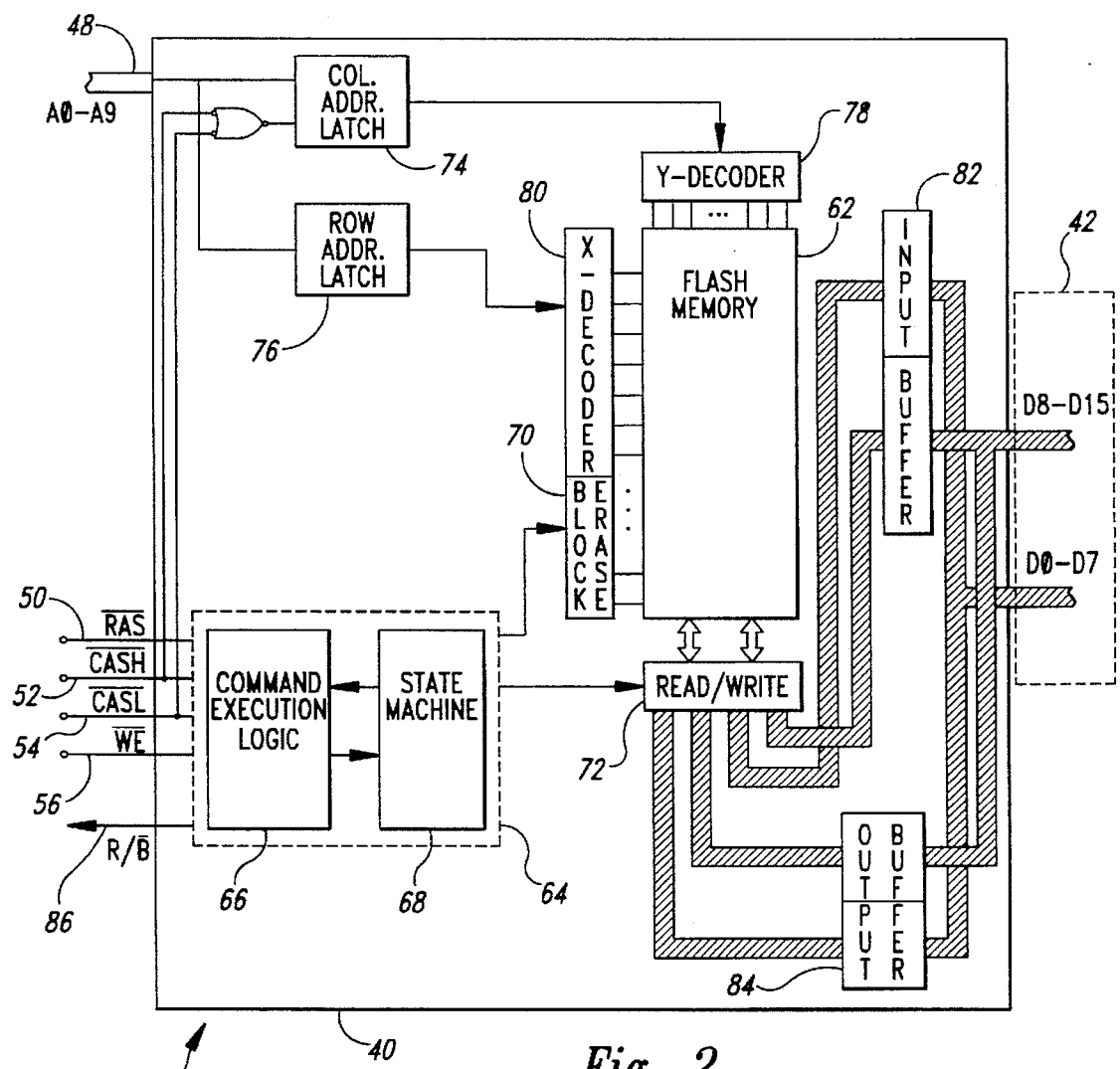
FIG. 2 is a functional block diagram of a DRAM-compatible, nonvolatile memory according to the invention.

According to the invention, the memory array 41 inside the package 40 is a nonvolatile DRAM-compatible memory 60, as shown in FIG. 2. The DRAM-compatible memory 60 is a nonvolatile memory containing as its central memory element a FLASH EEPROM memory 62. It will be understood that, while the preferred embodiment of the invention employs the FLASH memory 62, other types of nonvolatile memories, including standard EEPROMs or other erasable programmable memories may be used for the memory assay 41 within the scope of the invention.

All primary operational features of the DRAM compatible memory 60 are made to look generally like the operational features of a DRAM from an outside package viewpoint. Thus, data transfer to and from the FLASH memory assay 62 is made to look generally like DRAM data transfer. Once data and address are input to the package 40, the data transfer to the memory itself is under control of a logic controller 64 having two principal parts, command execution logic 66 and a state machine 68. The logic controller 64 receives external signals from the RAS line 50, the CAS lines 52, 54, and the write enable line 56 and provides control signals to a block erase circuit 70 and read/write controller 72, each of which is coupled to the FLASH memory 62. The block erase circuit 70 is any known circuit of the prior art that provides command signals to erase selected blocks of the FLASH memory 62, many such circuits being known in the art. The read/write controller 72 provides data to and accepts data from the FLASH memory 62 according to an established data transfer protocol.

In addition to receiving erase, read, and write commands from the block erase circuit 70 and the react/write controller 72, the FLASH memory 62 receives address signals from the address line 48 via a column address latch 74 and a row address latch 76, as decoded by a Y-decoder 78 and an X-decoder 80. Data from the data bus 42 is input to the FLASH memory 62 through the read/write controller 72 via respective data input and data output buffers 82, 84.

Figure 3:
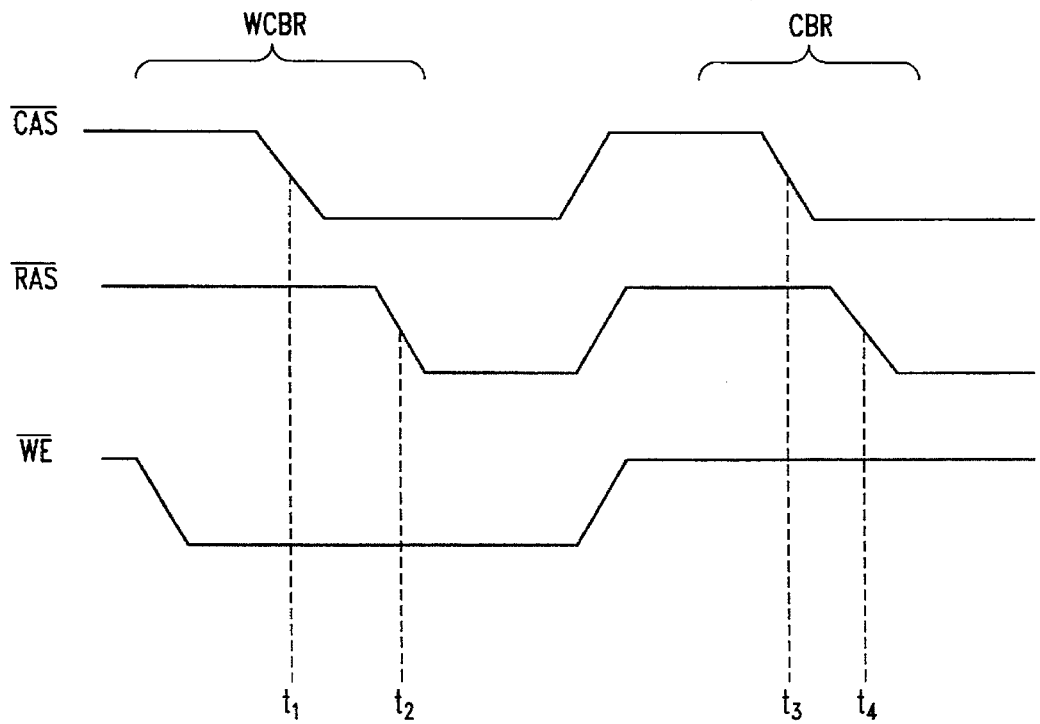
FIG. 3 is a timing diagram showing a WCBR sequence followed by a CBR sequence for use with the nonvolatile memory of FIG. 2.
Figure 4:
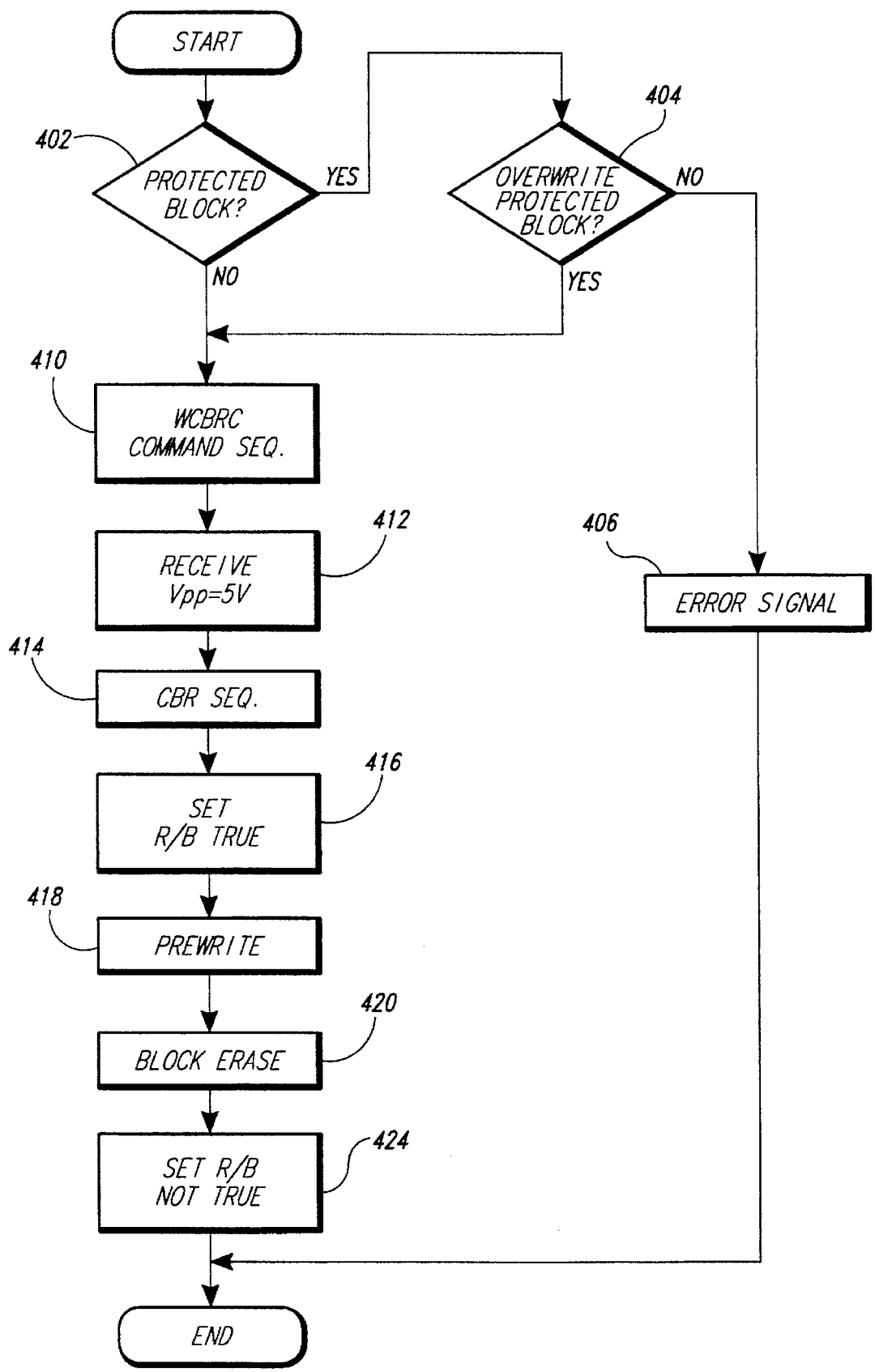
FIG. 4 is a logic flow diagram showing an erase sequence within the device of FIG. 1.

Operation of the DRAM-compatible memory 60 of FIG. 2 is best explained with the timing and logic diagrams of FIGS. 3–4. In step 400 of FIG. 4, prior to initiating a write sequence, the logic controller 64 reviews the address in the FLASH memory 62 to which data is to be written, as identified by the data in the column address latch 74 and row address latch 76. Then, the logic controller 64 determines if the block is a protected block in step 402 and, if the block is a protected block, the logic controller 64 determines if it is enabled to overwrite the protected block in step 404. If the logic controller 64 is unable to overwrite the protected block, it produces an error signal in step 406 and ends the write routine. If the logic controller 64 is enabled to overwrite locked blocks, or if the block is not a protected block, the logic controller 64 awaits a proper command sequence.

The command sequence for writing to the FLASH memory 62 is an externally provided WCBR-CBR sequence shown in FIG. 3. The WCBR-CBR sequence is a timed sequence of three separate signals on the RAS line 50, one of the CAS lines 52 or 54 and the write enable line 56, respectively. It should be noted that each of the signals CAS, RAS and WE is a low-true signal. That is, the signal is considered to be true when the signal is in its low state and the signal "goes true" when it goes from a high state to a low state.

As shown in FIG. 3, at a time $t_1$, the column address select signal CAS goes low (true) while the row address select signal RAS is high (not true). At time $t_2$, after the time $t_1$, the row address select signal goes low (true). Thus, the CBR sequence (CAS-before-RAS) has occurred because the column address signal CAS goes true at a time $t_1$ before the row address select signal RAS goes true. Further to the right in FIG. 3, the CBR sequence is repeated at times $t_3$ through $t_4$. The repetition of the CBR sequence is recognized as a part of the command sequence by the logic controller 64 to initiate a read or write command.

For added protection, the logic controller 64 also requires an additional condition to the repetition of a CBR sequence to initialize a write. The additional condition is that the write enable signal WE must be low (true) during the first CBR sequence, such that the first CBR sequence can be considered a special form of CBR sequence called a WCBR sequence (Write enabled CBR sequence). As seen at times $t_1$ and $t_2$ in FIG. 3, the write enable signal WE is low during the CBR sequence creating a valid WCBR sequence. The WCBR sequence is input to the logic controller 64 in step 410 and the logic controller 64 verifies that a write protect voltage $V_{pp}$ has been supplied to the FLASH memory 62 in step 412. Then, the write enable signal WE is set high (not true) during the second CBR sequence in step 414 such that the WCBR-CBR command sequence is complete.

After receiving the WCBR-CBR sequence in steps 410, 412, and 414, the logic controller 64 initiates an erase sequence by producing a ready/busy signal R/B indicating that the block erase procedure has begun in step 416. To provide an external indication of the busy state of the DRAM-compatible memory 60, the busy signal is output on a ready/busy pin 86 which is one of the extra pins 58 described above.

Next in step 418, the block erase circuit 70 (FIG. 2), as instructed by the logic controller 64, performs a prewrite to the memory cells in a block identified by the address in the column address latch 74 and the row address latch 76, as is conventional for FLASH memories. After the block is prewritten, it is erased in step 420. After the erase is complete, the DRAM-compatible memory 60 is made available for reading or writing by setting the busy signal R/B on line 86 to a "not true" state in step 424.

To begin a write operation to an erased address, a user provides a write command to the logic controller 64, a row address and column address on the address line 48 and data on the data bus 42. The data passes from the data bus 42 through the input buffer 82 to the read/write controller 72. As directed by the logic controller 64, the read/write controller 72 writes the data from the input buffer 82 into the memory cells indicated by the row and column addresses.

Reading from the DRAM-compatible memory 60 follows conventional DRAM protocol. When a conventional read command and row and column addresses are received by the DRAM-compatible memory 60, data in the FLASH memory 62 is made available on the data bus 42, through the output buffer 84.

Because the DRAM-compatible memory 60 of FIG. 2 includes all of the signal inputs described above with respect to the conventional DRAM package 40 of FIG. 1, the DRAM-compatible memory 60 can be implemented in the DRAM package 40 for insertion to a conventional DRAM socket. As discussed above, in the conventional DRAM package 40, the DRAM-compatible memory 60 utilizes one of the extra pins 58 for the ready/busy pin 86.

Figure 5:
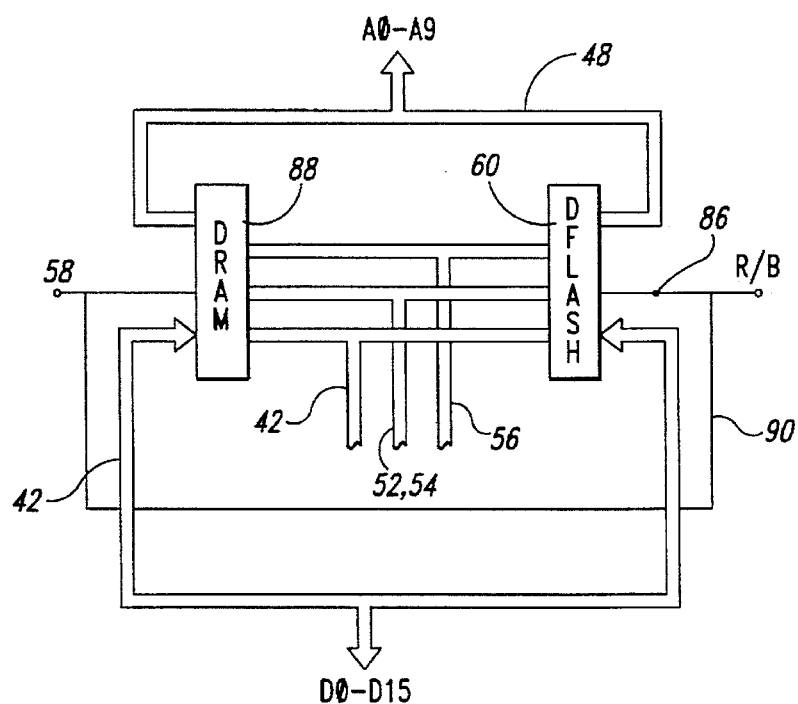
FIG. 5 is a diagrammatic representation of a DRAM and a DRAM-compatible nonvolatile memory coupled to common data, address and write-enable buses.

Because the DRAM-compatible memory 60 is packaged in a conventional DRAM package 40, and utilizes conventional DRAM command sequences and protocol, the DRAM-compatible memory 60 may be linked to a common RAS line 50, common CAS lines 52, 54 and a common write enable line 56 with a DRAM 88, as shown in FIG. 5. Also, the DRAM-compatible memory 60 may use a common data bus 42 and a common address bus 48 with the DRAM 88.

To read from or write to the DRAM-compatible memory 60, external control logic would produce the WCBR-CBR sequence by repeating the CBR signal while toggling the write enable signal WE as discussed above. The WCBR-CBR sequence would also be perceived as valid read and write commands by the DRAM 88 and by the DRAM-compatible memory 60. The actual memory location would be provided by a decoded address signal on the common address bus 48. The external logic can therefore read from and write to addresses in the DRAM 88 or the DRAM-compatible memory 60 with an identical command sequence and with a single address bus. While the presently preferred embodiment utilizes a WCBR-CBR sequence to initialize an erase command, one skilled in the art will recognize that various other sequences or command protocols may be utilized without departing from the spirit and scope of the invention. It will be appreciated that the total time to write data to the FLASH memory 62 may be somewhat longer than the time to write to a conventional DRAM. This merely causes a longer write time in the standard operation but it is otherwise a standard write operation for a DRAM type memory.

Figure 6:
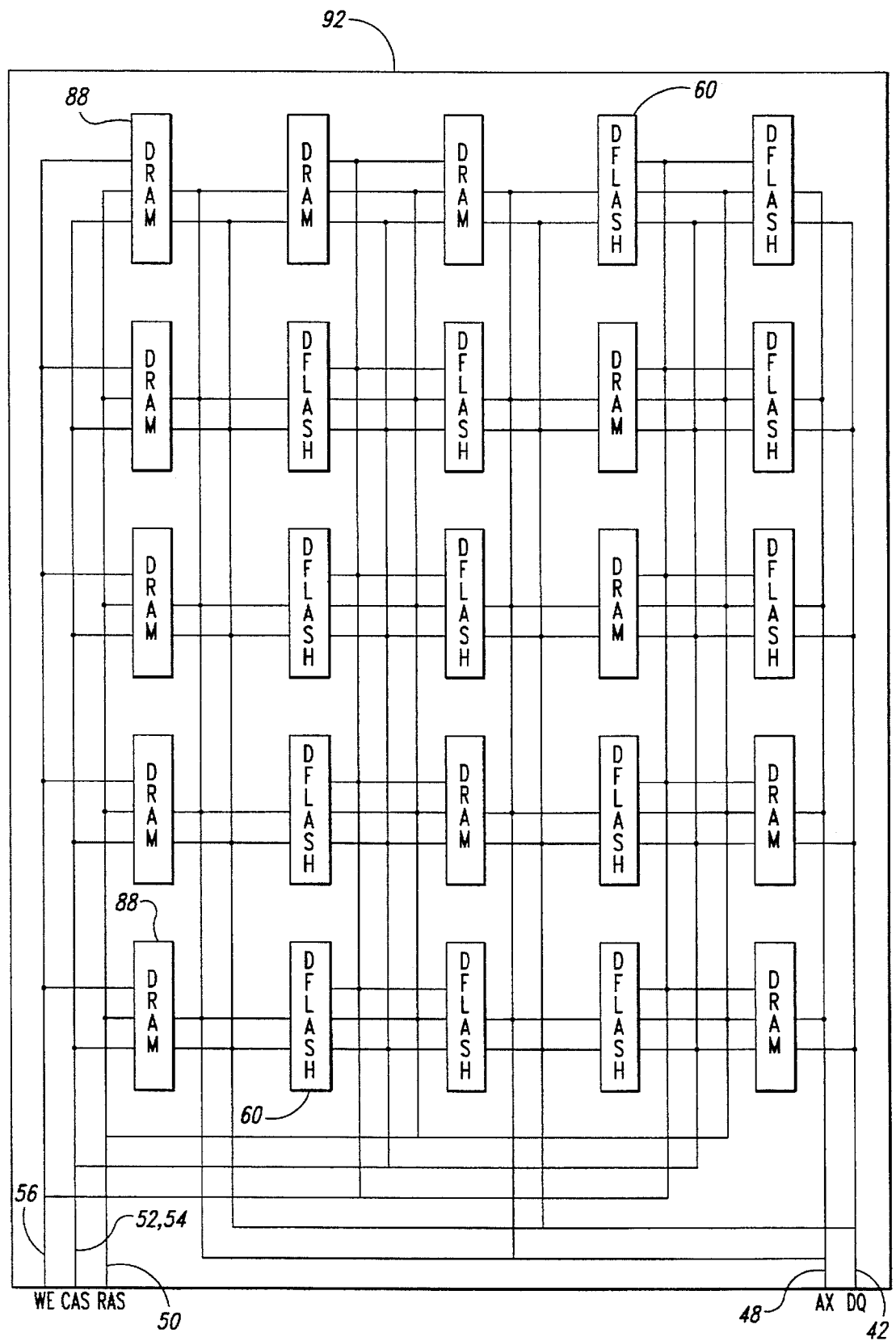
FIG. 6 is a schematic diagram of a memory card incorporating both conventional DRAMs and nonvolatile memories, using common address, data and control signal buses.

FIG. 6 shows how the DRAM-compatible memory 60 can be used together with a conventional DRAM 88, and with common connections, both types of devices can be mounted to a common memory board 92, either in a chip socket or any other suitable mount. The DRAMs 88 and DRAM-compatible memories 60 are commonly connected to the RAS line 50, CAS lines 52, 54, the write enable line 56, the address bus 48 and the data bus 42. Before writing to the DRAM-compatible memory 60, the external control logic monitors the busy signal R/B on a ready/busy line within an R/B bus 90. The ready/busy line is connected to the ready/busy pin 86 of the DRAM-compatible memory 60. Because the ready/busy pin 86 corresponds to one of the unused or optional use pins 58 of the DRAM 88 the ready/busy line connected to the DRAM 88 does not present an incorrect signal to the external logic.

The memory card 92 thus contains both fast, volatile memory (the DRAMs 88) and programmable, nonvolatile memory (the DRAM-compatible memories 60) accessible from common buses. Such a memory card 92 may be implemented in a variety of fashions, such as with a single in-line memory module (SIMM). One skilled in the art will appreciate that while the memory card 92 of FIG. 6 includes 12 DRAMs 88 and 13 DRAM-compatible memories 60, the relative numbers of each of the memories 60, 88, may be varied depending upon the particular application. For example, if a substantial portion of the memory capacity of the memory card 92 is to be used for a computer operating system or some other "read-mostly" type of data, the number of nonvolatile, DRAM-compatible memories 60 will be increased as the speed of writing data and the number of projected write cycles are not critical in such "read-mostly" applications. If, however, the memory card 92 is to be used for data which is rapidly changing, the number of DRAMs 88 will be increased because of the higher speed of the DRAMs 88 and the higher number of read/write cycles available for common DRAMs 88.

From the foregoing it will be appreciated that, although embodiments of the invention have been described herein for purposes of illustration, various modifications may be made without deviating from the spirit and scope of the invention. For example, the central memory element of the DRAM-compatible memory 60 has been described as a FLASH memory device 62, although other forms of nonvolatile memory may be used within the scope of the invention. Similarly, the particular command sequences may be modified to conform to various control protocols in specific applications. Accordingly, the invention is not limited except as by the appended claims.

I claim:

1. An integrated memory circuit, comprising:

a single integrated circuit package having an external RAS input terminal and an external CAS input terminal;

an electrically erasable nonvolatile memory array within an integrated circuit package;

an address bus;

an address buffer within the integrated circuit package coupled to the address bus to receive addresses from the address bus, the address buffer having an address output connected to the electrically erasable nonvolatile memory array;

a row address line coupled to the memory array;

a row address select line coupled to the RAS input terminal and configured to receive a RAS signal according to volatile memory timing and logic states;

a column address line coupled to the electrically erasable nonvolatile memory array;

a column address select line coupled to the CAS input terminal and configured to receive a CAS signal according to volatile memory timing and logic states;

a logic controller within the integrated circuit package, the logic controller having a first input connected to the row address select line and a second input connected to the column address select line, the logic controller having a first output coupled to the electrically erasable nonvolatile memory, the logic controller being operative to supply commands according to electrically erasable nonvolatile memory timing and logic states in response to the RAS and CAS signals on the row address select line and column address select line; and a block erase circuit within the integrated circuit package and coupled to receive commands from the logic controller, the block erase circuit further being coupled to the electrically erasable nonvolatile memory array, the block erase circuit being operative to provide commands to the electrically erasable nonvolatile memory array in response to commands from the logic controller.

2. The integrated memory circuit of claim 1 wherein the logic controller includes:

a write enable input terminal; and a write enable line coupled to the write enable input terminal from external to the integrated circuit package.

3. The integrated memory circuit of claim 1, further including a data input buffer within the integrated circuit package and having a data output connected to the nonvolatile memory array, the data input buffer further including a control input terminal, wherein the logic controller is coupled to the control input terminal to provide a store control signal to the control input terminal to store data from the data input buffer into the nonvolatile memory array.

4. The integrated memory circuit of claim 3, further including a data output buffer within the integrated circuit package and having a data input connected to the nonvolatile memory array, the data output buffer further including a control input terminal wherein the logic controller is connected to the control input terminal of the data output buffer to provide a read control signal to the control input terminal to read data from nonvolatile memory array into the data output buffer.

5. A reconfigurable memory board having nonvolatile memory capability comprising:

a memory card having a data line input transfer line, a RAS line, a CAS line, and a plurality of chip mounts, each chip mount having a data input terminal coupled to the data input line, a data output terminal coupled to the data output line, a RAS input terminal coupled to the RAS line and a CAS input terminal coupled to the CAS line wherein the terminal patterns of the chip mounts are the same;

a plurality of volatile memory chips mountable in the chip mounts, each volatile memory chip having a RAS pin, a CAS pin, a data input pin, and a data output pin, respectively positioned in pin locations corresponding to the RAS input terminal, CAS input terminal, data input terminal and data output terminal, respectively; and a plurality of nonvolatile memory chips mountable in the chip mounts, each nonvolatile memory chip having a RAS pin, a CAS pin, a data input pin, and a data output pin, respectively positioned in the pin locations corresponding to the RAS input terminal, CAS input terminal, data input terminal and data output terminal.

6. The reconfigurable memory circuit of claim 5 wherein the memory card includes a write enable line, and each of the volatile memory chips and the nonvolatile memory chips includes a write enable pin connectable to the write enable line wherein the write enable pins of the volatile memory chips and the nonvolatile memory chips have identical pin locations.

7. The reconfigurable memory board of claim 5 wherein each of the nonvolatile memory chips includes within the chip:

a memory array; and a logic controller connected to the RAS input terminal and the CAS input terminal, the logic controller further being coupled to the memory array to control data flow into and out of the memory array in response to signals on the RAS input terminal and the CAS input terminal.

8. The reconfigurable memory circuit of claim 7 wherein the nonvolatile memory chips comprise FLASH memory chips.

9. The reconfigurable memory circuit of claim 7 wherein the memory card is a single in-line memory module.

10. A memory card comprising:

an address bus;

a row address line;

a column address line;

a row address select line;

a column address select line;

a data bus;

an integrated electrically erasable programmable read only memory circuit having a RAS input coupled to the row address select line and a CAS input coupled to the column address select line, a row address input coupled to the row address line, a column address input coupled to the column address line, an enable line, the electrically erasable programmable read only memory having an output coupled to the data bus; and an integrated dynamic random access memory (DRAM) having a RAS input connected to the row address select line, a CAS input connected to the column address select line, a row address input coupled to the row address line and a column address input coupled to the column address line, the DRAM having an output coupled to the data bus.

11. The memory card of claim 10 wherein the integrated electrically erasable programmable read only memory circuit further includes a logic controller coupled to the RAS input.

12. The memory card of claim 11 wherein the logic controller is also coupled to the CAS input.

13. The memory card of claim 10 wherein the integrated electrically erasable programmable read only memory circuit further includes a data input buffer having a data input coupled to the data bus.

14. The memory card of claim 10, further including a write enable line and wherein the integrated electrically erasable programmable read only memory circuit includes a write enable input terminal coupled to the write enable line.

15. A method for storing data in a memory location in an electrically erasable programmable read only memory coupled to a logic controller, the memory location having an address, comprising:

providing the address at an address bus;

storing the address in an address buffer coupled to receive addresses from the address bus;

providing a control sequence to the logic controller according to conventional DRAM command sequence timing and logic states;

generating an internal erase command with the logic controller in response to the control sequence;

supplying the internal erase command to the electrically erasable programmable read only memory;

supplying the address of the memory location from the address buffer to the electrically erasable programmable read only memory;

erasing the memory location in response to the internal erase command; and writing data to the erased memory location.

16. The method of claim 15 wherein the step of providing a control sequence to the logic controller according to conventional DRAM command sequence timing and logic states comprises the steps of:

providing a column address select signal to a column address select input of the logic controller;

providing a row address select signal to a row address select input of the logic controller; and repeating the step of providing a column address select signal to the column address select input of the logic controller.

17. The method of claim 16 wherein the step of providing a control sequence to the logic controller further includes the step of:

after repeating the step of providing the column address select signal to the column address selected input of the logic controller, repeating the step of providing the row address select signal to the row address select input of the logic controller.

18. The method of claim 17 wherein the step of providing a control sequence to the logical controller further includes the steps of:

providing a write signal in a first state when performing the step of providing the column address select signal to the column address select input; and providing the write signal in a second state when performing the step of repeating the step of providing the column address signal to the column address select input.

19. The method of claim 16, further including the step of storing data in a data buffer and wherein the step of writing data to the memory location comprises the steps of retrieving data from the data buffer and storing the retrieved data in the erased memory location.

20. A method for erasing data from a memory location in an electrically erasable nonvolatile memory coupled to a logic controller, the memory location having an address, comprising:

providing the address to the electrically erasable nonvolatile memory;

providing a control sequence to the logic controller according to conventional DRAM command sequence timing and logic states;

generating an internal erase command with the logic controller in response to the control sequence;

supplying the internal erase command to the electrically erasable programmable read only memory;

entering an internal erase mode in the electrically erasable programmable read only memory in response to the internal erase command; and erasing the memory location.

21. The method of claim 20, further including the step of:
prewriting the memory location prior to erasing the memory location.

22. The method of claim 21 wherein the step of providing a control sequence to the logic controller according to conventional DRAM command sequence timing and logic states comprises the steps of:

providing a column address select signal to a column address select input of the logic controller;

providing a row address select signal to a row address select input of the logic controller; and repeating the step of providing a column address select signal to the column address select input of the logic controller.

23. The method of claim 22 wherein the step of providing a control sequence to the logic controller further includes the step of:

after repeating the step of providing the column address select signal to the column address selected input of the logic controller, repeating the step of providing the row address select signal to the row address select input of the logic controller.

24. The method of claim 23 wherein the step of providing a control sequence to the logical controller further includes the steps of:

providing a write enable signal in a first state when performing the step of providing the column address select signal to the column address select input; and providing the write enable signal in a second state when performing the step of repeating the step of providing the column address signal to the column address select input.

25. The method of claim 22, further including the step of storing data in a data buffer and wherein the step of writing data to the memory location comprises the steps of retrieving data from the data buffer and storing the retrieved data in the erased memory location.

* * * * *